United States Patent [19]

Gailus et al.

[11] Patent Number: 5,535,247

[45] Date of Patent: Jul. 9, 1996

[54] FREQUENCY MODIFIER FOR A TRANSMITTER

[75] Inventors: Paul H. Gailus, Prospect Heights; Mark A. Gannon, Sleepy Hollow; Steven F. Gillig, Roselle, all of Ill.

[73] Assignee: Motorola, Inc., Schaumburg, Ill.

[21] Appl. No.: 126,479

[22] Filed: Sep. 24, 1993

[51] Int. Cl.$^6$ ................................................. H04K 1/02
[52] U.S. Cl. ...................... 375/297; 375/298; 375/302; 455/112; 455/118; 455/119; 455/126; 332/103; 332/124; 330/107; 330/149; 330/207 R; 331/23
[58] Field of Search .................. 375/39, 59, 60; 332/103, 149, 161, 162, 117, 123, 124, 126; 455/42, 110, 112, 113, 119, 118, 126; 330/2, 107, 140, 207; 331/18, 23, 30

[56] References Cited

U.S. PATENT DOCUMENTS

| | | | |
|---|---|---|---|
| 3,289,082 | 11/1966 | Shumate | 375/261 |
| 3,854,094 | 12/1974 | Towler | 455/119 |
| 3,993,868 | 11/1976 | Balcewicz | 332/16 |
| 4,068,198 | 1/1978 | Otto | 455/113 |
| 4,291,277 | 9/1981 | Davis et al. | 375/297 |
| 4,373,115 | 2/1983 | Kahn | 332/162 |
| 4,929,906 | 5/1990 | Voyce et al. | 332/162 |
| 5,021,754 | 6/1991 | Shepherd et al. | 332/128 |
| 5,066,922 | 11/1991 | Leitch | 455/126 |
| 5,075,643 | 12/1991 | Einbinder | 455/113 |
| 5,216,425 | 6/1993 | Erhage | 375/39 |
| 5,319,675 | 6/1994 | Osaka | 375/59 |
| 5,381,108 | 1/1995 | Whitmarsh et al. | 455/126 |
| 5,434,887 | 7/1995 | Osaka | 375/295 |

*Primary Examiner*—Stephen Chin
*Assistant Examiner*—Amanda T. Le
*Attorney, Agent, or Firm*—Susan L. Lukasik

[57] ABSTRACT

A transmitter has an oscillator (101, 201, 303, 401, 501) that operates at frequency k multiplied by $f_c$, thus the oscillator (101, 201, 303, 401, 501) outputs a signal at an output frequency, $kf_c$. Coupled to the oscillator (101, 201, 303, 401, 501) is a frequency modifier (103, 205, 307, 405, 505), for modifying the oscillator output frequency by factor 1/k, thereby producing a signal at frequency $f_c$ at the frequency modifier output. Coupled to the frequency modifier output is a modulator (105, 215, 301, 407–417, 507–517) for producing a modulated output signal substantially centered at frequency $f_c$.

25 Claims, 3 Drawing Sheets

FREQUENCY MODIFIER FOR A TRANSMITTER

FIELD OF THE INVENTION

This invention relates to radio frequency (RF) transmitters, including but not limited to voltage controlled oscillators for use in RF transmitters.

BACKGROUND OF THE INVENTION

RF transmitters are known that use complex modulators, which convert baseband, i.e., zero IF (intermediate frequency), signals, consisting of I (in-phase) and Q (quadrature) components, to RF signals using spectrally efficient modulation techniques such as QPSK (quadrature phase-shift keying), QAM (quadrature amplitude modulation), and so forth. To up convert the zero IF I and Q signals to an intermediate frequency, the prior art uses a VCO (voltage-controlled oscillator) to produce an offset oscillator signal at the same frequency. A significant problem that arises with this arrangement is the coupling of the modulated IF signal into the VCO, causing unwanted remodulation of the VCO and subsequent spectral spreading of desired IF signal. This coupling is accentuated by the extremely high loop gain of the VCO itself in the vicinity of its oscillation frequency.

In applications where modulation with fast spectral roll-off characteristics is used to increase spectral efficiency, remodulation levels below −60 dB are required. The problem is further accentuated in other designs where, in order to simplify the transmitter, it is desirable to perform direct conversion from zero IF to the transmit frequency. Direct conversion would eliminate the need for an offset synthesizer, an image filter, and other components using a modulator local oscillator injection at the transmitter output frequency. It is impractical to use shielding, particularly in portable equipment, to sufficiently reduce the coupling from the high powered modulated PA signal to a VCO operating at the same frequency such that the modulation is acceptable.

Accordingly, there is a need for an apparatus that reduces or eliminates remodulation such that fast spectral roll-off is achievable for a direct conversion or other transmitter.

DESCRIPTION OF A PREFERRED EMBODIMENT

Figure 1:
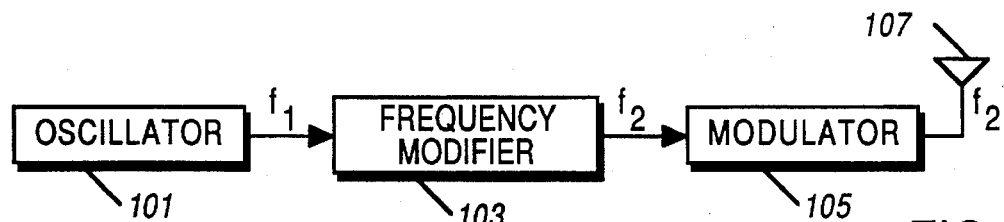
FIG. 1 is a block diagram of a transmitter with a frequency modifier, an oscillator, and a modulator in accordance with the invention.

The following describes an apparatus for reducing or eliminating remodulation coupling between a VCO and a transmitter output by operating the VCO at a different frequency than the desired carrier frequency of the transmitted signal. A frequency modifier modifies the frequency of the signal from the VCO for subsequent processing, including, modulation, such that coupling between the transmitter output and the VCO is negligible, because they are not at the same frequency.

In one embodiment, a transmitter comprises an oscillator operating at frequency k multiplied by $f_c$ ($kf_c$) and having an output at an output frequency. Coupled to the oscillator and having an output is a frequency modifier, for modifying the oscillator output frequency by factor $1/k$, producing a signal at frequency $f_c$ at the frequency modifier output. Coupled to the frequency modifier output is a modulator for producing a modulated output signal substantially centered at frequency $f_c$.

In another embodiment, a transmitter comprises an oscillator operating at frequency k multiplied by $f_c$ and having an output at an output frequency. Coupled to the oscillator and having an output is a frequency modifier, for modifying the oscillator output frequency by factor $1/k$, producing a signal at frequency $f_c$ at the frequency modifier output. Coupled to the frequency modifier output is a vector modulator for producing a modulated output signal substantially centered at frequency $f_c$. Operatively coupled to the frequency modifier output is a vector demodulator for implementing a Cartesian feedback linearization system, wherein the vector modulator has an output, which output is frequency translated before transmission, and the vector demodulator has an input signal, which is also frequency translated.

In yet another embodiment, an FM (frequency modulation) transmitter comprises an oscillator having an output and having a modulation input, whereby a modulation signal applied to the modulation input produces a modulated output substantially centered at output frequency k multiplied by $f_c$. Coupled to the oscillator and having an output is a frequency modifier for modifying the oscillator output frequency by factor $1/k$, producing a modulated signal substantially centered at frequency $f_c$ at the frequency modifier output.

In the above embodiments, the following are a few alternatives that may be applied. The modulated output signal may be transmitted without subsequent frequency translation. The modulated output signal may be power amplified before transmission. Subsequent frequency translation or subsequent frequency modification may occur. The modulator may be a vector modulator. When a vector modulator is used, the frequency modifier output may be operatively coupled to a vector demodulator for implementing a Cartesian feedback linearization system and further, the vector modulator has an output, which output may be frequency translated before transmission, and the vector demodulator has an input signal, which may also be frequency translated. The oscillator may be operatively coupled to and locked by a frequency synthesizer. The factor $1/k$ may be greater than 1, less than 1, or an integer greater than 1, or k may be an integer greater than 1.

A block diagram of a transmitter with a frequency modifier, an oscillator, and a modulator is shown in FIG. 1. An oscillator 101 at frequency $f_1$ has an output, a sinusoidal signal at frequency $f_1$, which is input to frequency modifier 103. A frequency modifier modifies, by a factor $1/k$, the frequency of the input signal from the oscillator to a second frequency $f_2$ that is to be the carrier frequency ($f_c$) of the transmitted signal. This modification may include dividing by an integer, dividing by a rational number, multiplying by an integer, and multiplying by a rational number. Thus, $1/k$ may be greater than 1, less than 1, or an integer greater than 1, or k may be an integer greater than 1. In the preferred embodiment, 1/k can be 0.5 or 0.25 (therefore the factor k is 2 or 4, respectively) and implemented by the use of frequency dividers, commonly implemented with CMOS (complementary metal-oxide semiconductor) or ECL (emitter-coupled logic) circuitry. The factor 1/k could also be 2, 3, or 4 and implemented using frequency multipliers, the implementation of which is known to those skilled in the art. Those skilled in the art can appreciate that 1/k can be other integers or that k could be other integers and those skilled in the art can appreciate that there are known techniques (fractional dividers, varactor multipliers) to achieve 1/k or k values that are non-integers.

Figure 2:
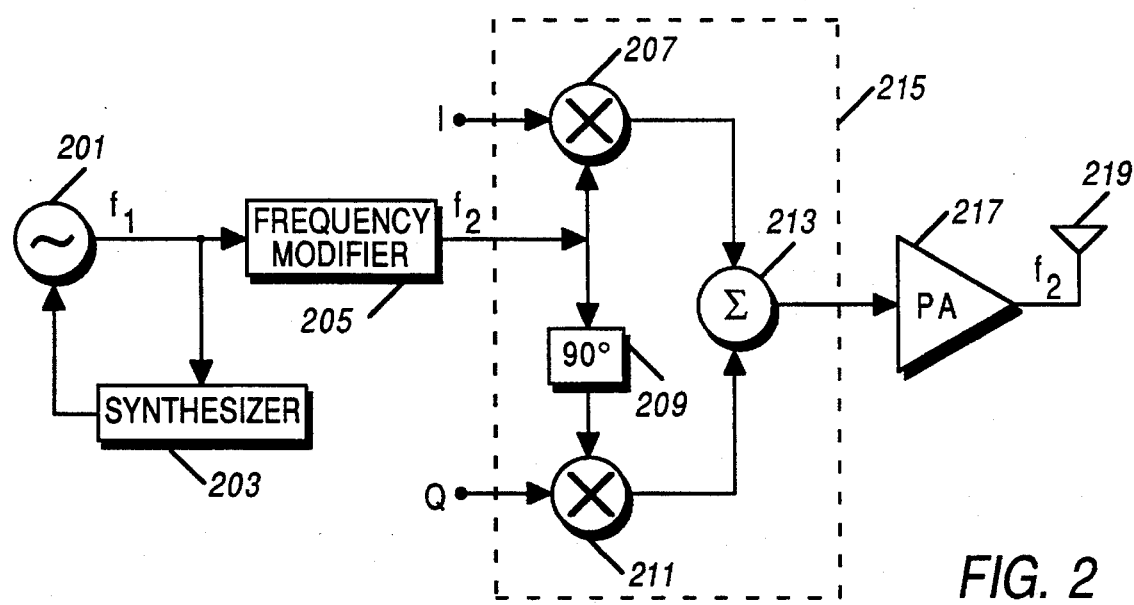
FIG. 2 is a block diagram of a transmitter with a frequency modifier and a quadrature modulator in accordance with the invention.

The output of the frequency modifier 103 is input to a modulator 105. The modulator may be a linear quadrature modulator, a frequency modulator, a linear quadrature modulator used within a linearization system, or any other type of modulator. The output of the modulator 105 is input to an appropriate output element, such as an antenna 107, at carrier frequency A block diagram of a transmitter with a frequency modifier and a quadrature modulator, also known as a vector modulator, is shown in FIG. 2. A VCO 201 operates at frequency $f_1$, which frequency is controlled and stabilized by a conventional frequency synthesizer 203. The output of the VCO 201, a sinusoidal signal at frequency $f_1$, is input to the synthesizer 203 and to a frequency modifier 205. The frequency modifier modifies the frequency of the output from the VCO 201 in the same way as described for the frequency modifier 103 of FIG. 1. The output of the frequency modifier 205 is at carrier frequency $f_2$. The output of the frequency modifier 205 is input to a first mixer 207 and a 90-degree phase-shifter 209. The output of the phase-shifter 209 is input to a second mixer 211. The in-phase part of the signal to be modulated is also input to the first mixer 207, and the quadrature portion of the signal to be modulated is also input to the second mixer 211. The outputs of the mixers 207 and 211 are input to a summer 213, the output of which is input to a power amplifier (PA) 217. The signal out of the PA 217 is output at frequency $f_2$ to an appropriate output element, such as an antenna 219. The modulator 215 is a linear modulator.

Figure 3:
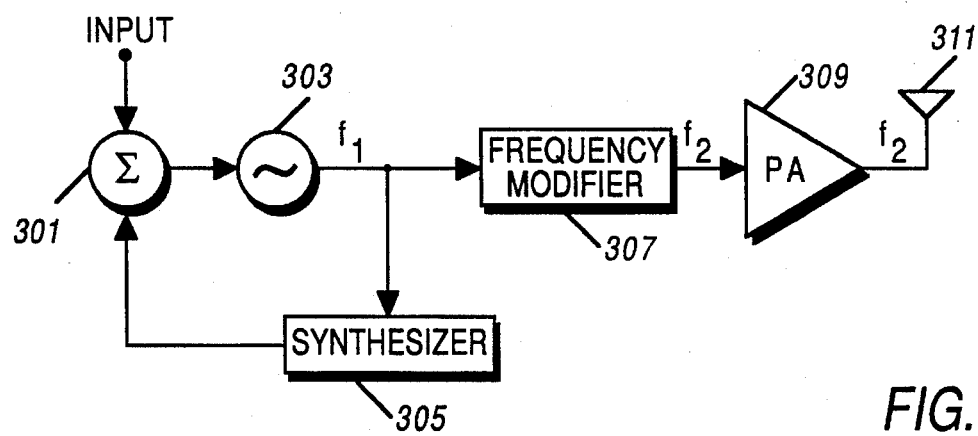
FIG. 3 is a block diagram of an FM transmitter with a frequency modifier in accordance with the invention.

A block diagram of an FM transmitter with a frequency modifier is shown in FIG. 3. The signal to be modulated is input to the input terminal of a summer 301. The output of the summer 301 is input to a VCO 303, which operates at frequency $f_1$. In the preferred embodiment, the output of the VCO 303, a sinusoidal signal at frequency $f_1$, is input to a conventional frequency synthesizer 305, which controls and stabilizes the frequency of the VCO 303. The output of the synthesizer 305 is input to a second input to the summer 301. The output of the VCO 303 is also input to a frequency modifier 307, which modifies its input signal from the VCO 303 to a carrier frequency $f_2$ in the same way as described for the frequency modifier 103 of FIG. 1. The output of the frequency modulator is input to a PA 309. The output of the PA 309 is transmitted at the carrier frequency $f_2$ via an antenna 311.

Figure 4:
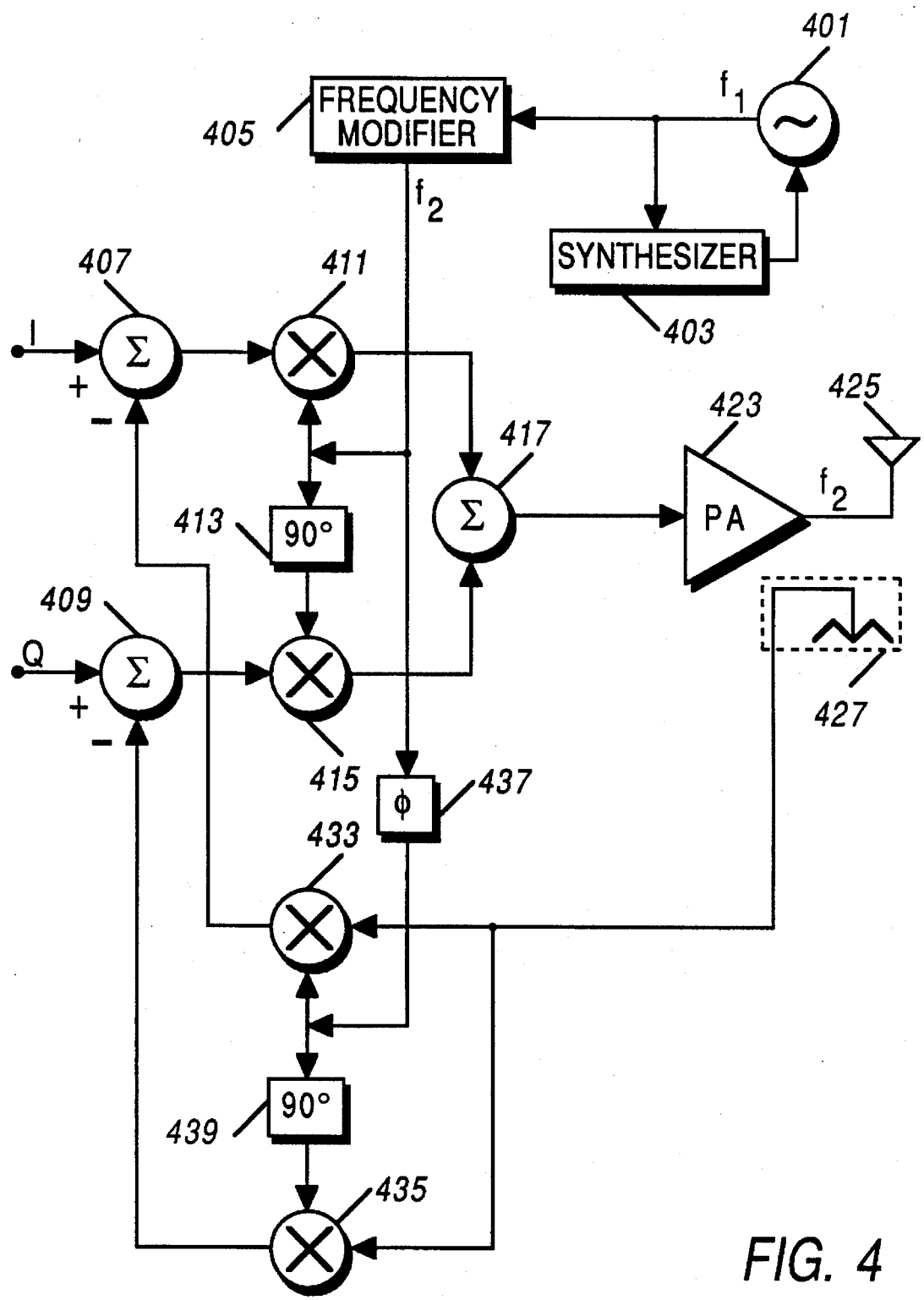
FIG. 4 is a block diagram of a direct conversion linear transmitter with frequency modification and a Cartesian feedback loop in accordance with the invention.

A block diagram of a direct conversion linear transmitter with frequency modification and a Cartesian feedback loop is shown in FIG. 4. A VCO 401 outputs a signal at frequency $f_1$ to a frequency modifier 405. The frequency modifier 405 modifies its input signal from the VCO 401 to a carrier frequency $f_2$ in the same way as described for the frequency modifier 103 of FIG. 1. The output of the VCO is also input to a conventional frequency synthesizer 403, whose output is input to the VCO 401 in order to control the frequency of the VCO, such that the frequency is stable. The output of the frequency modifier is input to a mixer 411 and a 90-degree phase-shifter 413, and also input to a second phase shifter 437, which shifts phase by a factor φ. An in-phase portion of the signal to be modulated is input to a first summer 407, whose output is also input to a first mixer 411. The quadrature portion of the signal to be modulated is input to second summer 409, the output of which is input to a second mixer 415.

The output of the 90-degree phase-shifter 413 is also input to the second mixer 415. The outputs of the two mixers 411 and 415 are input to a third summer 417. The output of the third summer 417 is input to a PA 423. The output of the PA 423 is sent at carrier frequency $f_2$ to an appropriate output element 425, such as an antenna in a radio for transmission of the signal at the carrier frequency $f_2$. A coupler 427 responsive to the output of the PA 423 provides a feedback signal to a third mixer 433 and a fourth mixer 435. The output of the phase-shifter 437 is input to the third mixer 433 and a second 90-degree phase-shifter 439, the output of which phase-shifter 439 is input to a fourth mixer 435. The output of the third mixer is input to the negative input of the first summer 407, and the output of the fourth mixer 435 is input to the negative input terminal of the second summer 409, thus completing the Cartesian feedback loop.

Because the VCO is not at the same frequency as the output signal, baseband signals can be converted directly to RF and there is little RF coupling between the PA and VCO, resulting in a VCO with a faster frequency lock and a transmitted signal with less coupling of interference and hence faster spectral roll-off than with conventional RF shielding.

Figure 5:
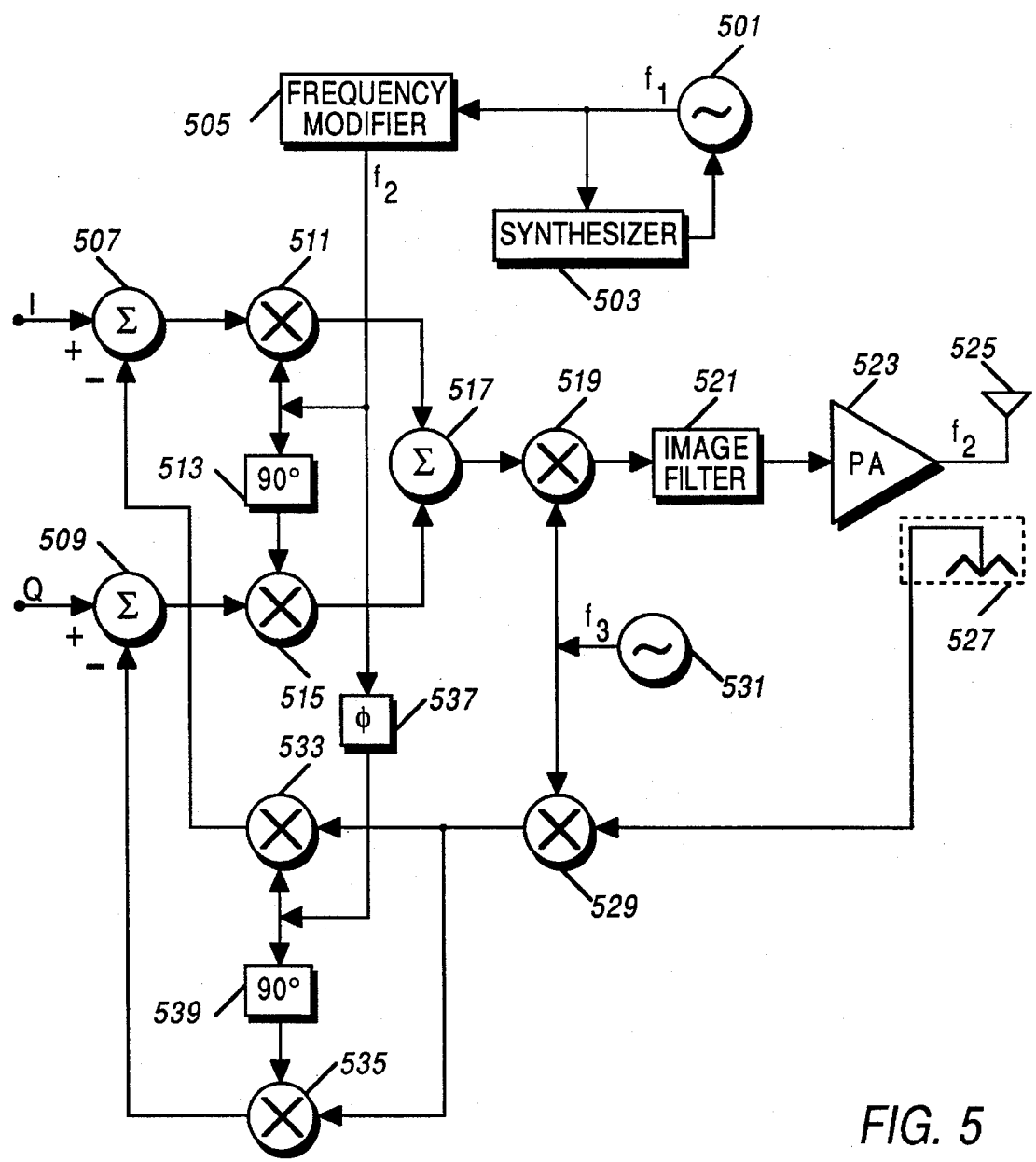
FIG. 5 is a block diagram of a dual conversion linear transmitter with frequency modification and a Cartesian feedback loop in accordance with the invention.

A block diagram of a dual conversion linear transmitter with frequency modification and a Cartesian feedback loop is shown in FIG. 5. A VCO 501 outputs a signal at frequency $f_1$ to a frequency modifier 505. The frequency modifier 505 modifies its input signal from the VCO 501 to a carrier frequency $f_2$ in the same way as described for the frequency modifier 103 of FIG. 1. The output of the VCO is also input to a conventional frequency synthesizer 503, whose output is input to the VCO 501 in order to control the frequency of the VCO, such that the frequency is stable. The output of the frequency modifier is input to a mixer 511 and a 90-degree phase-shifter 513, and also input to a second phase shifter 537, which shifts phase by a factor φ. An in-phase portion of the signal to be modulated is input to a first summer 507, whose output is also input to a first mixer 511. The quadrature portion of the signal to be modulated is input to second summer 509, the output of which is input to a second mixer 515.

The output of the 90-degree phase-shifter 513 is also input to the second mixer 515. The outputs of the two mixers 511 and 515 are input to a third summer 517. The output of the third summer 517 is input to a third mixer 519. The output of the third mixer 519 is input to an image filter 521, which filters off the undesired signal sideband that is the result of the mixing process of the third mixer 519. The output of the image filter 521 is input to a PA 523. The output of the PA 523 is sent at carrier frequency $f_2$ to an appropriate output element 525, such as an antenna in a radio for transmission of the signal at the carrier frequency $f_2$. A coupler 527 responsive to the output of the PA 523 provides a feedback signal to a fourth mixer 529. A second VCO 531 provides a sinusoidal signal at frequency $f_3$ to the third mixer 519 and the fourth mixer 529. The output of the fourth mixer 529 is input to a fifth mixer 533 and a sixth mixer 535. The output of the phase-shifter 537 is input to the fifth mixer 533 and a second 90-degree phase-shifter 539, the output of which phase-shifter 539 is input to a sixth mixer 535. The output of the fifth mixer is input to the negative input of the first summer 507, and the output of the sixth mixer 535 is input to the negative input terminal of the second summer 509, thus completing the Cartesian feedback loop.

Because the VCO is not at the same frequency as the output signal or at the signal which is output of the summer 517, baseband signals can be converted directly to RF and there is little RF coupling between the PA and VCO, resulting in a VCO with a faster frequency lock and a transmitted signal with less coupling interference and hence faster spectral roll-off than with conventional RF shielding. The use of the frequency modifier in the instance when the final output is frequency translated is beneficial, because the output of the quadrature modulator summer 517 can interact with the VCO 501 and cause remodulation of the VCO without the use of a frequency modifier, even though the signal level output of the summer 517 is typically less than the signal level output of the PA 523 or of the PA 423 which is in a system that does not employ frequency translation. Those skilled in the art can appreciate that in a system having a VCO with an output at a certain frequency and also a signal present in the system with energy components at or near that certain frequency, interaction between the signal and the VCO can occur, which cause remodulation of the VCO and widen its output spectrally.

There is always some degree of interaction between a VCO and a signal within a system at or substantially near the VCO's operating frequency. This manifests itself as frequency modulation of the VCO by the signal, with the VCO deviation being proportional to the amount of interaction (otherwise known as coupling). For an FM transmitter, like the one described in FIG. 3, this amounts to a frequency jump upon initial PA turn-on (or key-up) as the phase of the coupled signal from the PA is different from the phase of the VCO signal, and this phase discontinuity causes the synthesizer to move the VCO's output frequency in order to re-acquire sufficient phase to re-lock the VCO. Hence, lock time is impaired. Additionally, the deviation of the FM output signal 311 will be changed by the interaction. This problem can be compensated for by adjusting the input signal summed by summer 301, and because in practice the degree of interaction can vary, this interaction causes the deviation to be not what is precisely desired.

The signal and VCO interaction causes sideband spreading in a linear transmitter, as in the ones depicted in FIG. 2 and FIG. 4. Because in these cases the VCO is desired to be unmodulated (i.e., 'clean' in the technical vernacular), any modulation of the VCO by the above-described interaction is undesired and causes spectral spreading. Remodulation levels on the VCO below −60 dBc are extremely difficult to achieve, even with conventional RF shielding, with signal and VCO proximities found in conventional mobile and portable radio equipment. The use of a frequency modifier substantially eliminates this interaction by placing the VCO operating frequency substantially away from the signal frequency and eliminates the FM problems described above and the remodulation that is undesirable in a linear transmitter.

What is claimed is:

1. A transmitter comprising:

an oscillator operating at frequency k multiplied by $f_c$ and having an output at output frequency k multiplied by $f_c$, wherein k is a scaling factor;

a frequency modifier, coupled to the oscillator and having an output, for modifying the oscillator output frequency by factor 1/k, producing a signal at frequency $f_c$ at the frequency modifier output;

a vector modulator, coupled to the frequency modifier output, for producing a vector modulated output signal substantially centered at frequency $f_c$; and a vector demodulator, operatively coupled to the frequency modifier output, for implementing a Cartesian feedback linearization system.

2. The transmitter of claim 1, wherein the vector modulated output signal is transmitted without subsequent frequency translation.

3. The transmitter of claim 1, wherein the vector modulated output signal is power amplified before transmission.

4. The transmitter of claim 1, wherein one of subsequent frequency translation and subsequent frequency modification occurs.

5. The transmitter of claim 1, wherein the oscillator is a voltage-controlled oscillator.

6. The transmitter of claim 1, wherein the oscillator, frequency modifier, the vector modulator, and the vector demodulator are disposed in a radio.

7. The transmitter of claim 1, wherein the vector modulated output signal is frequency translated before transmission, and the vector demodulator has an input signal, which is also frequency translated.

8. The transmitter of claim 1, wherein the factor 1/k is an integer greater than 1.

9. The transmitter of claim 1, wherein k of the factor 1/k is an integer greater than 1.

10. The transmitter of claim 1, wherein the factor 1/k is a non-integer greater than 1.

11. The transmitter of claim 1, wherein the factor 1/k is a non-integer less than 1.

12. The transmitter of claim 1, wherein the oscillator is operatively coupled to and locked by a frequency synthesizer.

13. A transmitter comprising:

an oscillator having an output, the oscillator constructed to produce a signal substantially centered at output frequency k multiplied by $f_c$;

a frequency modifier, coupled to the oscillator and having an output, the frequency modifier constructed to modify the oscillator output frequency by factor 1/k and to produce a modulated signal substantially centered at frequency $f_c$ at the frequency modifier output;

a vector modulator, coupled to the frequency modifier, the vector modulator constructed such that a vector modulated output signal substantially centered at frequency $f_c$ is produced; and a vector demodulator, operatively coupled to the frequency modifier output, for implementing a Cartesian feedback linearization system.

14. The transmitter of claim 13, wherein the vector modulated output signal is transmitted without subsequent frequency translation.

15. The transmitter of claim 13, wherein the vector modulated output signal is power amplified before transmission.

16. The transmitter of claim 13, wherein one of subsequent frequency translation and subsequent frequency modification occurs.

17. The transmitter of claim 13, wherein the factor 1/k is an integer greater than 1.

18. The transmitter of claim 13, wherein k of the factor 1/k is an integer greater than 1.

19. The transmitter of claim 13, wherein the factor 1/k is a non-integer greater than 1.

20. The transmitter of claim 13, wherein the factor 1/k is a non-integer less than 1.

21. The transmitter of claim 13, wherein the oscillator is operatively coupled to and locked by a frequency synthesizer.

22. The transmitter of claim 13, wherein the oscillator, frequency modifier, the vector modulator, and the vector demodulator are disposed in a radio.

23. The transmitter of claim 13, wherein the vector modulator has a vector modulator output, which vector modulator output is frequency translated before transmission, and the vector demodulator has an input signal, which is also frequency translated.

24. A transmitter comprising:

a first oscillator operating at frequency k multiplied by $f_c$ and having an output at output frequency k multiplied by $f_c$, wherein k is a scaling factor;

a frequency modifier, coupled to the oscillator and having a frequency modifier output, for modifying the oscillator output frequency by factor 1/k, producing a signal at frequency $f_c$ at the frequency modifier output;

a vector modulator, coupled to the frequency modifier output, for producing a vector modulated output signal substantially centered at frequency $f_c$;

a second oscillator operating at a frequency f;

a first frequency translator, coupled to the second oscillator and the vector modulator output and having a first frequency translator output;

a second frequency translator, operatively coupled to the second oscillator and the first frequency translator output and having a second frequency translator output;

a vector demodulator, operatively coupled to the frequency modifier output and the second frequency translator output, for implementing a Cartesian feedback linearization system.

25. A transmitter comprising:

a voltage-controlled oscillator arranged and constructed to operate at frequency k multiplied by $f_c$ and having an output at output frequency k multiplied by $f_c$, wherein k is a scaling factor;

a frequency modifier, coupled to the voltage-controlled oscillator and having an output, arranged and constructed to modify the voltage-controlled oscillator output frequency by factor 1/k, producing a signal at frequency $f_c$ at the frequency modifier output; and a vector modulator, coupled to the frequency modifier output, arranged and constructed to produce a vector modulated output signal substantially centered at frequency $f_c$.

* * * * *